United States Patent
Park et al.

(10) Patent No.: US 10,642,154 B2
(45) Date of Patent: May 5, 2020

(54) SURFACE FUNCTIONAL COMPOSITE FILM AND METHOD OF FABRICATING THE SAME

(71) Applicant: UNIVERSITY-INDUSTRY FOUNDATION(UIF), YONSEI UNIVERSITY, Seoul (KR)

(72) Inventors: Hyung-Ho Park, Seoul (KR); Yoon Kwang Lee, Gyeonggi-do (KR)

(73) Assignee: UNIVERSITY-INDUSTRY FOUNDATION(UIF), YONSEI UNIVERSITY, Seoul (KR)

( * ) Notice: Subject to any disclaimer, the term of this patent is extended or adjusted under 35 U.S.C. 154(b) by 148 days.

(21) Appl. No.: 15/171,607

(22) Filed: Jun. 2, 2016

(65) Prior Publication Data

US 2016/0354802 A1 Dec. 8, 2016

(30) Foreign Application Priority Data

Jun. 2, 2015 (KR) .................. 10-2015-0077670
May 31, 2016 (KR) .................. 10-2016-0067703

(51) Int. Cl.
*B05D 3/06* (2006.01)
*B32B 5/14* (2006.01)
(Continued)

(52) U.S. Cl.
CPC .......... *G03F 7/0043* (2013.01); *B05D 3/067* (2013.01); *B32B 5/145* (2013.01); *G03F 7/027* (2013.01); *G03F 7/095* (2013.01)

(58) Field of Classification Search
CPC ......... G03F 7/027; G03F 7/095; B32B 5/145; B32B 15/08–098; B32B 2310/0831;
(Continued)

(56) References Cited

U.S. PATENT DOCUMENTS 5,780,525 A * 7/1998 Ryang .................. C08F 2/44
522/104
2009/0022995 A1 * 1/2009 Graham .................. B82Y 30/00
428/409
(Continued)

FOREIGN PATENT DOCUMENTS

KR  10-0710983 B1    4/2007
KR  10-2010-0125339 A   11/2010
(Continued)

OTHER PUBLICATIONS

Ohkubo, T. et al. Nanospace-enhanced photoreduction for the synthesis of copper(I) oxide nanoparticles under visible-light irradiation. Journal of Colloid and Interface Science, 2014, vol. 421, pp. 165-169. (Year: 2014).*
(Continued)

*Primary Examiner* — Stephen E Rieth
(74) *Attorney, Agent, or Firm* — Saliwanchik, Lloyd & Eisenschenk

(57) ABSTRACT

Provided are embodiments related to a surface functional composite coating film and a method of fabricating the same. The surface functional composite coating film may include a resin coating layer; a surface functional metal compound layer formed on the resin coating layer; and an interface layer having gradually changing composition distribution of a metal constituting the metal compound between the resin coating layer and the surface functional metal compound layer.

6 Claims, 12 Drawing Sheets

(51) Int. Cl.
*G03F 7/004* (2006.01)
*G03F 7/095* (2006.01)
*G03F 7/027* (2006.01)

(58) Field of Classification Search
CPC .. B32B 2255/205; C08K 3/22; C08K 3/2279; C08F 2/46–2/50; B05D 3/067
See application file for complete search history.

(56) References Cited

U.S. PATENT DOCUMENTS

| | | | | |
|---|---|---|---|---|
| 2009/0224234 A1* | 9/2009 | Kim | ............ | C01G 1/02 |
| | | | | 257/40 |
| 2012/0112219 A1* | 5/2012 | Jang | ............ | B82Y 20/00 |
| | | | | 257/98 |
| 2018/0072907 A1* | 3/2018 | Balan | ............ | C09D 11/52 |

FOREIGN PATENT DOCUMENTS

| KR | 10-2014-0015143 A | 2/2014 |
|---|---|---|
| KR | 10-2014-0136320 A | 11/2014 |
| KR | 10-2015-0046912 A | 5/2015 |

OTHER PUBLICATIONS

Mustatea, G.; Calinescu, I.; Diacon, A.; Balan, L. Photoinduced synthesis of silver/polymer nanocomposites. Materiale Plastice, 2014, 51, 17-21 (Year: 2014).*

* cited by examiner

SURFACE FUNCTIONAL COMPOSITE FILM AND METHOD OF FABRICATING THE SAME

CROSS-REFERENCES TO RELATED APPLICATION

This application claims priority under 35 U.S.C. § 119 to Korean Patent Application Nos. 10-2015-0077670,filed Jun. 2, 2015 and 10-2016-0067703, filed May 31, 2016, which are herein incorporated by reference in their entirety.

BACKGROUND OF THE INVENTION

1. Field of the Invention

The present invention relates to a coating technique, and more particularly, to a surface functional composite coating film and a method of fabricating the same.

2. Description of the Related Art

Recently, in the view of problematic issues on strength, safety upon destruction, costs in installation and fabrication, and material weights, plastic materials that are relatively inexpensive, light-weighted, easily-formable, and safe are being spotlighted, instead of conventional tempered glass materials. For example, according to recent rapid popularization of various mobile devices, a demand for developing a transparent plastic polymer material as an alternative for weight reduction of liquid crystals used for a display unit is increasing.

Surface characteristics of plastic materials, such as chemical resistance, mechanical strength, or high-temperature stability, are not yet sufficient compared to those of glass materials. Therefore, to enhance such characteristics, organic-inorganic hybrid-type surface protective coating layers formed by dispersing inorganic materials in plastic polymer materials or coating inorganic materials onto surfaces of plastic polymer materials are widely used.

However, although such organic-inorganic hybrid-type surface protective coating layers may secure advantages of organic materials, such as flexibility and formability, the technique of dispersing an inorganic material into a plastic polymer material has problems including an excessive consumption of the inorganic material and an increase in a thickness of the coating layer. Furthermore, in case of a hybridizing approach of forming a polymer material layer, and then, coating a separate inorganic material layer onto the polymer material layer, the interface between the inorganic material layer and the polymer material layer at the surface of the surface protecting coating layer is unstable due to a problem, such as accumulation of stress, and thus the inorganic material layer may be easily exfoliated from the underlined polymer material layer. Furthermore, in case of a conventional organic-inorganic hybrid-type surface protective coating layer, due to separated two-steps process, i.e., forming a polymer material layer, and then, coating an inorganic material layer, the entire process for fabricating the organic-inorganic hybrid-type surface protective coating layers become complicated and expensive, where defects caused by the complicated process also deteriorates the production yield.

SUMMARY OF THE INVENTION

The present invention provides a surface functional composite coating film that provides a stable interface between an upper inorganic material layer and a lower polymer material for improved interlayer adhesiveness and is capable of providing functionality unique to the inorganic material.

The present invention also provides a method of inexpensively fabricating a surface functional composite coating film having the above-stated advantages.

According to an aspect of the present invention, there is provided a surface functional composite coating film including a resin coating layer; a surface functional metal compound layer formed on the resin coating layer; and an interface layer having gradually changing composition distribution of a metal constituting the metal compound between the resin coating layer and the surface functional metal compound layer.

The resin coating layer may comprise a layer cured through a photo coupling reaction based on an UV irradiation. In addition, the resin coating layer may be an organic/inorganic coating layer and the organic/inorganic coating layer may include inorganic particles dispersed in a resin-based matrix or coupled with the resin-based matrix.

The surface functional metal compound layer may comprise a metal oxide, a metal nitride, a metal carbide, or a mixture thereof. The surface functional metal compound layer may be a 2-dimensional film structure, a planar pattern, or a 3-dimensional object. In addition, the surface functional composite coating film may be a mechanical, physical, or chemical surface protecting layer, an anti-contamination layer, an anti-fingerprint layer, a glossy layer, a light diffusing layer, a light screening layer, an anti-static charge layer, a screening layer, or a semiconductor layer.

According to other aspect of the present invention, there is provided a method of fabricating a surface functional composite coating film, the method including a first step for forming a solution comprising a surface functional resin coating film forming precursor; a second step for forming a composite coating sol by stirring a photochemical organic metal precursor in the solution formed in the first step; a third step for applying the composite coating sol formed in the second step onto a substrate; a fourth step for drying the composite coating sol applied onto the substrate in the third step; and a fifth step for forming the surface functional composite coating film having a double-layer stacked structure by exposing the composite coating sol dried in the fourth step to UV rays.

In an example, in the fifth step, a step in which a resin coating film cured by UV rays irradiated thereto may be formed and a step in which a metal-containing compound may be formed through a photo reaction of the photochemical organic metal precursor may be sequentially performed.

In other example, the method of fabricating a surface functional composite coating film may include a first step for providing a resin coating film forming precursor curable through a photo coupling reaction based on an UV irradiation; a second step for providing a photochemical organic metal precursor that is capable of forming a metal-containing compound through a photo reaction based on the UV irradiation and exhibits a photo reaction speed slower than the curing speed of the resin coating film forming precursor through the optical coupling reaction; a third step for forming a coating solution comprising a composite coating precursor including a mixture of the resin coating film forming precursor and the photochemical organic metal precursor; a fourth step for forming a composite coating layer comprising the composite coating precursor; and a fifth step for forming the surface functional composite coating film having a double-layer stacked structure by exposing the composite coating layer to UV rays, In an example, the double-layer stacked structure may include the resin coating layer on the substrate and the surface functional metal compound layer on the resin coating layer. In addition, a step for adding a photo-initiator to the coating solution may be performed.

The resin coating film forming precursor may include at least one of an olygomer and a monomer that are able to be photo coupled, the olygomer may include an acrylate-based olygomer, an urethane-based olygomer, a polycarbonate-based olygomer, or a mixture thereof, and the monomer may comprise an acryl-based photo crosslinkable monomer, a derivative thereof, or a combination thereof. The photochemical organic metal precursor may comprise a compound that includes metal central atoms of one or more type and a ligand including at least one of oxygen, nitrogen, and carbon.

In addition, the ligand may include at least one of substituted acetylacetonate, unsubstituted acetylacetonate, dialkyl dithiocarbamate, carboxylate, pyridine, amine, diamine, arsine, diarsine, phosphine, diphosphine, arene, alkoxy ligand, acetyl acetonate substituted with alkyl ligand or aryl ligand, unsubstituted acetylacetonate, dialkyl dithiocarbamate, carboxylate, pyridine, amine, diamine, arsine, diarsine, phosphine, diphosphine, arene, alkoxy ligands, alkyl ligands, and aryl ligands or a mixture thereof, or the ligand may include oxalato, halogen, hydrogen, hydroxy, cyano, carbonyl, nitro, nitrito, nitrate, nitrosyl, ethylene, acetylene, thiocyanato, isothiocyanato, aquo, azid, carbonato, amine, or thio-carbonyl. The photochemical organic metal precursor may generate metal ions through an UV irradiation.

In an example, a solvent for forming the coating solution may include a carbonate-based solvent, an ether-based solvent, a ketone-based solvent, an alcohol-based solvent, or a mixture thereof. In addition, the coating solution may include at least one of a coupling agent, a viscosity control agent, a pigment, and a surfactant.

According to embodiments of the present invention, a protective coating film that resolves problems of a conventional film using organic materials and exhibits excellent durability may be manufactured.

Furthermore, according to a method of fabricating a surface functional composite coating film according to the present invention, by dispersing an organic material and an inorganic ceramics material respectively in the lower layer and the upper layer, the lower layer exhibits excellent adhesiveness between the organic material and a contacting portion of a surface of a substrate while an inorganic ceramics oxide is densely concentrated at the upper layer, and thus functional characteristics unique to the ceramics material may he applied. Furthermore, compared to a two-step coating technique for coating an inorganic material after coating an organic material, formation of a coating film may be completed with a single coating and curing operation. Furthermore, when materials different from each other are double-coated, adhesiveness at the interface between the materials is poor. However, according to the present invention, the interface between an organic material and an inorganic material exhibits gradual composition change, thereby exhibiting excellent integration.

Furthermore, in a composite coating film formed according to the present invention, distribution of a ceramics material on a surface is locally very dense and various inorganic oxide surfaces may be formed. Therefore, a composite coating film formed according to the present invention may be applied as various functional coating materials.

BRIEF DESCRIPTION OF THE DRAWINGS

The above and other features and advantages of the present invention will become more apparent from the following embodiments and the attached drawings in which.

DETAILED DESCRIPTION OF THE INVENTION

Figure 1:
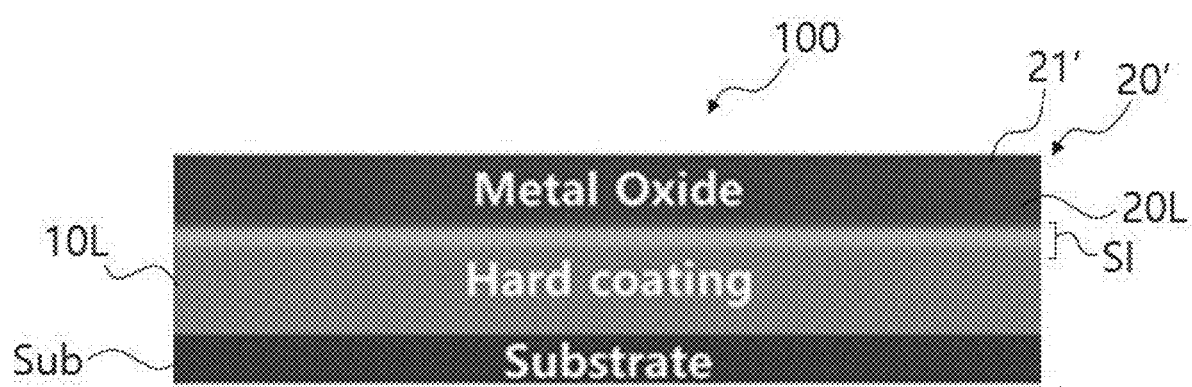
FIG. 1 is a sectional diagram showing the structure of a surface functional composite coating film according to an embodiment of the present invention.

The present invention will now be described more fully with reference to the accompanying drawings, in which exemplary embodiments of the present invention are shown.

The present invention may, however, be embodied in many different forms and should not be construed as being limited to the embodiments set forth herein; rather these embodiments are provided so that this disclosure will be thorough and complete, and will fully convey the concept of the present invention to one of ordinary skill in the art. Meanwhile, the terminology used herein is for the purpose of describing particular embodiments only and is not intended to be limiting of exemplary embodiments.

Also, thickness or sizes of layers in the drawings are exaggerated for convenience of description and clarity, and the same reference numerals denote the same elements in the drawings. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of the present invention.

FIG. 1 is a sectional diagram showing the structure of a surface functional composite coating film 100 according to an embodiment of the present invention.

Referring to FIG. 1, the surface functional composite coating film 100 may be formed on a substrate Sub. The substrate Sub may be a transparent housing of an automobile headlamp, a top substrate disposed above a display device or a touch panel of an electronic apparatus, such as a TV, a monitor, or a smart phone, a substrate disposed above a display unit of a smart phone, a camera lens, eye glasses, a cap of a cosmetic container, a toy, a prism, a magnetic part of a hard disk drive (a storage device), a construction material, a plastic object, or a glass window. However, those stated above in relation to the substrate Sub are merely examples, and the present invention is not limited thereto. For example, the substrate Sub may include a glass layer, a synthetic resin layer, a metal oxide layer, a semiconductor layer, a nano-wire layer, or a composite layer thereof and may or may not be optically transparent.

The surface functional composite coating film 100 has a double-layer stacked structure including a resin coating layer 10L, disposed on the substrate Sub and a surface functional metal compound layer 20L disposed on the resin coating layer 10L. FIG. 1 exemplifies that the resin coating layer 10L is a hard coating layer and the surface functional metal compound layer 20L is a metal oxide layer.

The resin coating layer 10L is a layer fabricated by using a resin coating film forming precursor that may be cured via an optical coupling reaction by an ultra-violet irradiation. According to an embodiment, the resin coating layer 10L may be a hard coating layer that is formed in order to protect the substrate Sub for improving scratch resistance, shock resistance, and/or corrosion resistance of a substrate constituting a display device. The hard coating layer may be an organic or inorganic coating layer that is formed of a resin-based matrix only, may be a silicon-containing resin-based organic or inorganic coating layer, or an organic or inorganic coating layer where inorganic particles like silica, titania, zirconia, or ceria are dispersed or coupled with inorganic atoms in the resin-based matrix.

In an example, the resin coating layer 10L may be directly formed on a surface of the substrate Sub and directly attached onto the substrate Sub, as shown in FIG. 1. In other example, after the surface functional composite coating film 100 having a double-layer stack structure is separately fabricated, the surface functional composite coating film 100 may be laminated onto a surface of the substrate Sub. In this case, if necessary, a binder layer may be provided between the resin coating layer 10L and the substrate Sub. In the present specification, the term substrate Sub may also refer to any surfaces having formed thereon a surface functional composite coating film and includes not only final products, but also any member having a release paper or a working surface like a base film for forming the surface functional composite coating film 100.

The surface functional metal compound layer 20L on the resin coating layer 10L is a material layer including a metal oxide (e.g., $SiO_2$, $Al_2O_3$, $TiO_2$, $SnO_2$, ZnO, SrO), a metal nitride (e.g., AlN, $Si_3N_4$), or a metal carbide (e.g., SiC) and may preferably be a metal oxide layer. In other example, a metal incorporated in the surface functional metal compound layer 20L may include one or more of a metal other than the above-stated metals, a metalloid, and a transition metal. However, the present invention is not limited thereto.

The surface functional metal compound layer 20L is a layer for strengthening the resin coating layer 10L or providing a special function for the resin coating layer 10L. According to material properties of materials constituting the surface functional metal compound layer 20L, the surface functional metal compound layer 20L may be used as a surface protecting layer having mechanical and physical properties like surface hardness and/or chemical properties like corrosion resistance. Furthermore, if necessary, the surface functional metal compound layer 20L may have optical properties, such as gloss, light diffusion, or light screen/electric and physical properties, such as anti-static charge, magnetic field barrier, or electric field barrier/anti-contamination resistance/anti-fingerprint/or semiconductor properties. However, the present invention is not limited thereto. As described above, the surface functional metal compound layer 20L may add various functions to the surface functional composite coating film 100 based on physical, chemical mechanical, or electric properties of a metal compound constituting the surface functional metal compound layer 20L.

Thickness of the surface functional metal compound layer 20L may be from dozens of nm to hundreds of μm, for example. Since a surface functional metal-containing compound is separately and locally concentrated on the resin coating layer 10L, the thickness, weight, and fabrication cost of the double layer 100 according to the present invention may be reduced compared to a coating structure in which a metal-containing compound is dispersed in the resin coating layer 10L and exhibits the same performance.

In the double layer stacked structure of the surface functional composite coating film 100 according to an embodiment of the present invention, a interface layer Si between the resin coating layer 10L and the surface functional metal compound layer 20L is not a layer clearly distinguished from layers above and below the interface layer SI and is a layer continuously formed as partial or entire compositions of the resin coating layer 10L and the surface functional metal compound layer 20L are gradually changed and are mixed with each other. In other words, the lower portion of the interface layer SI close to the resin coating layer 10L contains a material constituting the resin coating layer 10L more than a material constituting the surface functional metal compound layer 20L, whereas the upper portion of the interface layer SI close to the surface functional metal compound layer 20L has a composition opposite to the composition of the lower portion of the interface layer SI. As described above, since the interface layer SI has a continuous or gradual composition distribution between the surface functional metal compound layer 20L and the resin coating layer 10L, the resin coating layer 10L and the surface functional metal compound layer 20L having different material properties may be coupled with each other to provide a stable double-layer stacked structure while there is no an adhesive layer therebetween and it does not incur problems, such as stress development. Detailed description of the interface layer SI of the surface functional composite coating film 100 according to an embodiment of the present invention will be given below with reference to FIGS. 2A through 2F.

The surface functional composite coating film 100 as described above is not limited to a 2-dimensional film structure for coating and may have a planar pattern structure (e.g., a drawing or a character) or a 3-dimensional pattern structure (e.g., 3-dimensional objects having surfaces coated with metal-containing compound layers) for expressing information or shapes that are coated by an ink of an inkjet printer or a 3D printer and UV-irradiated for curing the ink. In this case, the lower layer of the pattern may become the resin coating layer 10L, whereas the upper layer of the pattern may be the surface functional metal compound layer 20L formed on the resin coating layer 10L.

FIGS. 2A through 2F are diagrams for describing a method of fabricating a surface functional composite coating film according to an embodiment of the present invention.

Figure 2A:
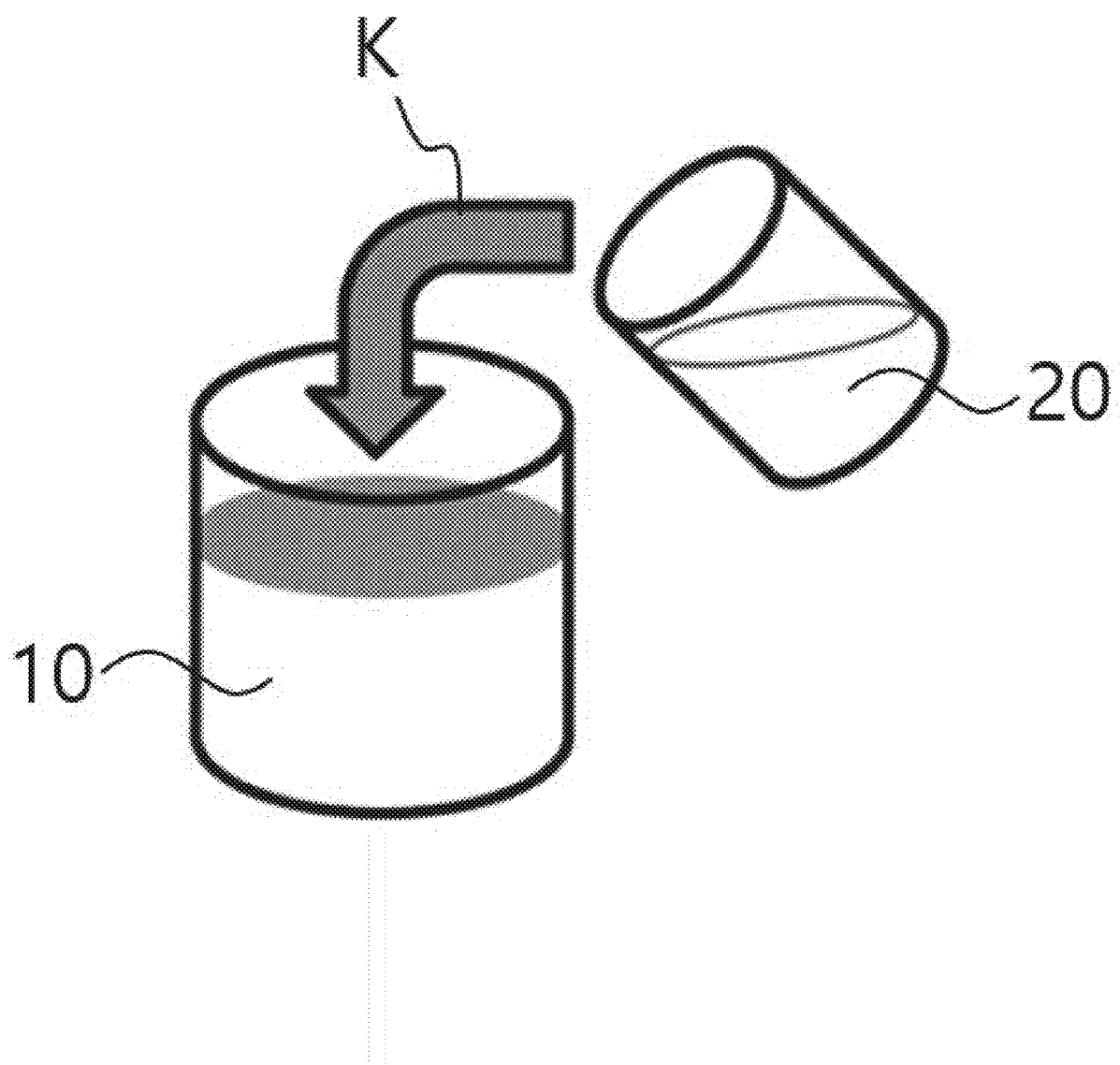
FIGS. 2A through 2F are diagrams for describing a method of fabricating a surface functional composite coating film according to an embodiment of the present invention.

Referring to FIG. 2A, a solution 10 including a resin coating film forming precursor may be provided. The resin coating film forming precursor includes a material that may be cured by being polymerized through an optical coupling by UV irradiation. According to an embodiment, the solution 10 may include at least one of an olygomer and a monomer and a solvent for solving or dispersing the at least one of an olygomer and a monomer. The olygomer may include an acrylate-based olygomer, a urethane-based olygomer, a polycarbonate-based olygomer, or a mixture thereof. However, the present invention is not limited thereto. The monomer may include an acryl-based photocrosslinkable monomer, a derivative thereof, or a combination thereof. For example, the light-crosslinkable monomer may include at least one selected from among polyethylene glycol diacrylate, triethylene glycol diacrylate, trimethylol propane ethoxylate triacrylate, bisphenol-A ethoxylate dimethacrylate acrylate, derivatives thereof and mixtures thereof. However, the present invention is not limited thereto. If the olygomer and the monomer are simultaneously applied, a mixture ratio thereof may be suitably adjusted between 0.1 weight %:99.9 weight % and 99.9 weight %:0.1 weight % accordingly to required properties and specification, such as hardness or light-transmissivity.

The solvent may include various organic solvents. For example, the solvent may be one of dimethyl carbonate (DMC), methyl acetate, other carbonate-based solvents, ether-based solvents, ketone-based solvents, and alcohol-based solvents. For example, the carbonate-based solvents may include dimethyl carbonate (DMC), diethyl carbonate (DEC), dipropyl carbonate (DPC), methyl propyl carbonate (MPC), ethyl propyl carbonate (EPC), methylethyl carbonate (MEC), ethylene carbonate (EC), propylene carbonate (PC), or butylene carbonate (BC). The ester-based solvents may include methyl acetate, ethyl acetate, n-propyl acetate, 1,1-dimethyl-ethyl acetate, methyl propionate, ethyl propionate, γ-butyrolactone, decanolide, valerolactone, mevalonolactone, or caprolactone.

The ether-based solvents as other examples of the organic solvents, may include dibutyl ether, tetraglyme, diglyme, dimethoxyethane, 2-methyl tetrahydrofuran, or tetrahydrofuran, whereas the ketone-based solvent may include cyclohexanone, methyl ethyl ketone, acetone, diacetone alcohol, polyhydric alcohols, ethers such as methyl cellosolve, ethyl cellosolve, butyl cellosolve, and cellosolve acetate, esters such as methyl acetate and ethyl acetate, halogenated hydrocarbons such as chloroform, methylene chloride, and tetrachloroethane, a nitrogen-containing compound such as nitromethane, acetonitrile, N-methylpyrrolidone, N, and N-dimethylformamide, and dimethylsulfoxide. The alcohol-based solvent may be ethyl alcohol or isopropyl alcohol, whereas aprotic solvent may an amide, such as nitrile-dimethyl formamide like R—CN (R is a straight, branched, or cyclic hydrocarbon radical of C2-C20 and may include a double cyclic bond or ether bonde), a dioxolane such as 1,3-dioxolane, or sulfolane such as flow-dioxolane. The organic solvent may be any one of or a combination of any two or more of the above-stated materials.

In another embodiment, the solvent may be a ketone based solvent such as methyl ethyl ketone, cyclohexanone, acetone, diacetone alcohol, polyhydric alcohol, an ether such as methyl cellosolve, ethyl cellosolve, butyl cellosolve, and cellosolve acetate, an ester such as methyl acetate and ethyl acetate, a halogenated hydrocarbons such as chloroform, methylene chloride, and tetrachloroethane, a nitrogen-containing compound such as nitromethane, acetonitrile, N-methylpyrrolidone, and N, N-dimethylformamide, and dimethyl sulfoxide, but is not limited thereto. Any one of the solvents or a mixture of two or more of the solvents may be used.

In some embodiments, at least one of an inorganic silica sol, a coupling agent, a viscosity control agent, a pigment, and a surfactant may be added to the solution 10. The additives may be dispersed in or chemically bonded to a resin coating layer (refer to 10L of FIG. 1) to be formed and enhance properties of the surface functional composite coating film 100. Details of the materials may be known in the art. For example, as a solvent, the solution 10 may be formed by using DPHA and DPEA-12 olygomers of Nippon Kayaku Co., Ltd, Nalco2327 inorganic silica sol of Unichem Co., Ltd, and KBM-503 disilane coupling agent of Dow Coming Co., Ltd. Furthermore, propylene glycol monomethyl ether may be used as the viscosity control agent.

The above-stated materials are merely examples, and the present invention is not limited thereto. For example, an olygomer, a monomer, or both for forming an acrylate-based resin material, a polyester-based resin material, a polyether-based resin material, an acryl-based resin material, an epoxy-based resin material, an urethane-based resin material, an alkyd-based resin material, a spiro-acetal-based resin material, a polybutadiene-based, or a polythiol polyene resin material to form a UV-curable coating film that may be cured through an photo coupling chemical reaction based on UV irradiation) may be included in the UV-curable coating solution.

Next, a photochemical organic metal precursor 20 is added to the solution 10. The photochemical organic metal precursor 20 is a material capable of forming a metal-containing compound, e.g., a metal oxide, a metal nitride, or a metal carbide, through a photo reaction based on UV irradiation, where the photo reaction of the photochemical organic metal precursor 20 is slower kinetically than curing of the resin coating film forming precursor through a photo coupling. For example, the photochemical organic metal precursor is a material including a ligand including at least one of oxygen, nitrogen, and carbon that provide electrons to one or more metals (as central atoms) including Al, Sr, Zn, or Ti. The photochemical organic metal precursor is a compound that forms an oxide, a nitride, or a carbide of the metal (central atom) through a photo reaction in which the ligand is decomposed by an UV irradiation.

For example, the ligand of the photochemical organic metal precursor 20 may be at least one of substituted acetylacetonate, unsubstituted acetylacetonate, dialkyl dithiocarbamate, carboxylate, pyridine, amine, diamine, arsine, diarsine, phosphine, diphosphine, arctic, alkoxy ligand, acetyl acetonate substituted with alkyl ligand or aryl ligand, unsubstituted acetylacetonate, dialkyl dithiocarbamate, carboxylate, pyridine, amine, diamine, arsine, diarsine, phosphine, diphosphine, arene, alkoxy ligands, alkyl ligands, and aryl ligands or a mixture thereof. In another embodiment, the ligand may include oxalato, halogen, hydrogen, hydroxy, cyano, carbonyl, nitro, nitrito, nitrate, nitrosyl, ethylene, acetylene, thiocyanato, isothiocyanato, aquo, azid, carbonato, amine, or thio-carbonyl.

For example, the photochemical organic metal precursor 20 may be a compound such as strontium-2ethylhexanate or barium-titanium dual metal alkoxide (BaTi(OR)$_x$). As the photochemical organic metal precursor 20 absorbs an UV ray, electrons in a ligand compound are excited, become unstable, and are decomposed, and thus metal ions are oxidized, nitrified, or carbonized, the photochemical organic metal precursor 20 may form a surface functional metal compound layer (refer to 20L of FIG. 1).

Figure 2B:
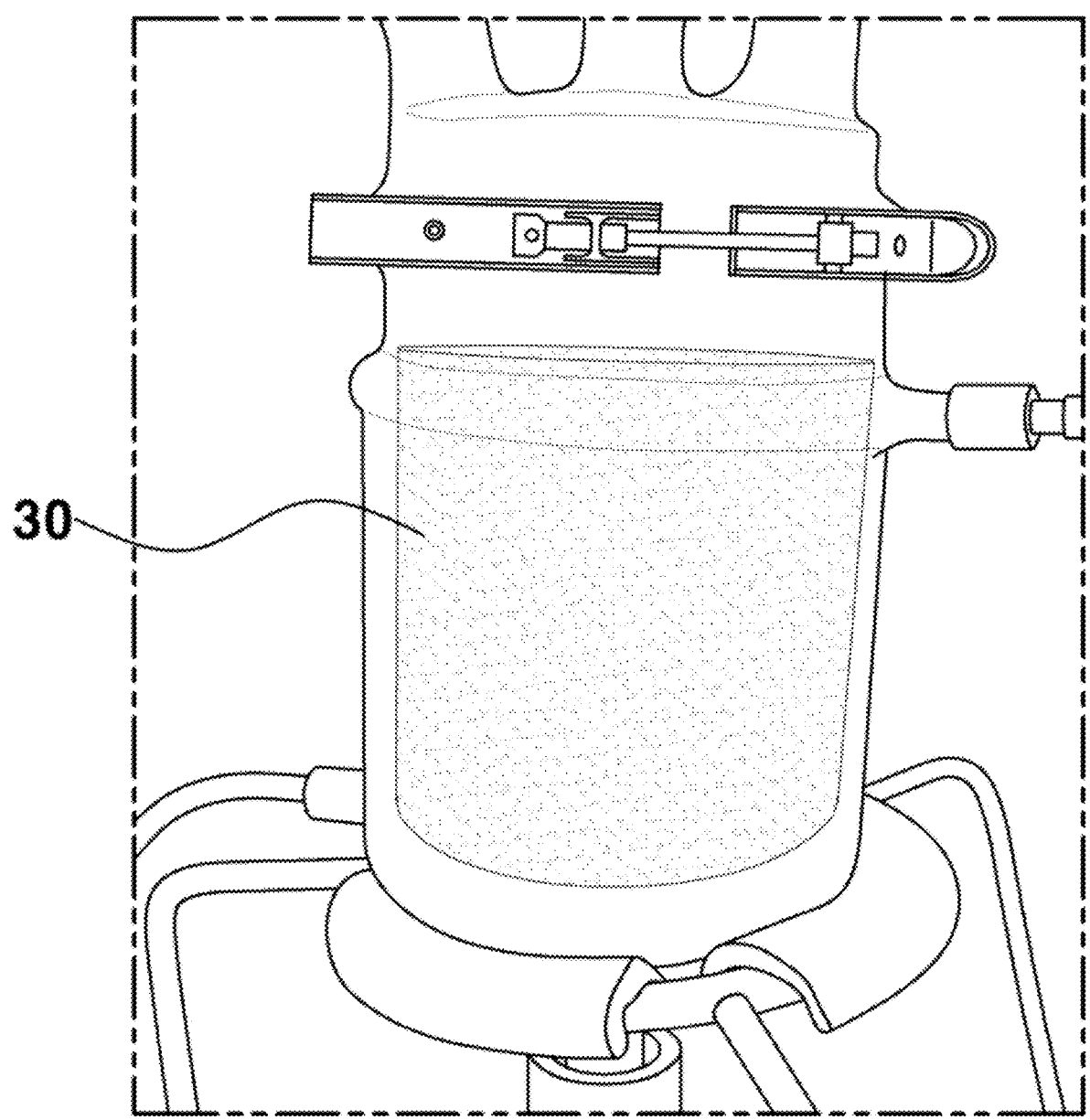

The photochemical organic metal precursor 20 as described above is mixed into the solution 10 as indicated with the arrow K. Therefore, as shown in FIG. 2B, a coating solution including a composite coating precursor 30 including a mixture of a resin coating film forming precursor and the photochemical organic metal precursor is formed. In order to provide a uniform coating solution, stirring operations may be sufficiently performed to the coating solution.

When a UV-curing coating solution and the photochemical organic metal precursor are sufficiently mixed with each other, a photo-initiator may be added thereto, and the mixture may be sufficiently stirred. The photo-initiator may be added before the photochemical organic metal precursor is mixed with the resin coating film forming precursor. However, the present invention is not limited thereto. However, by adding the photo-initiator in the final operation for forming a coating solution, unintended curing of the resin coating film forming precursor and unintended photo reaction of the photochemical organic metal precursor due to ambient UV rays may be prevented.

The photo-initiator may be any of photo-initiators known in the art, e.g., a benzophenone compound like 1-hydroxy cyclohexyl phenyl ketone. The coating solution mixed with the photo-initiator may be additionally stirred in a dark room.

A viscosity control agent may be added to the coating solution, such that the coating solution has a suitable viscosity for coating, where the coating solution may be provided as a sol state. Although, in the above-stated embodiment, a coating solution including a composite coating precursor is formed by forming a solution by dissolving a resin coating film forming precursor into a solvent and adding a photochemical organic metal precursor to the solution, it is merely an example, and the present invention is not limited thereto. For example, the coating solution may also be formed by simultaneously adding the resin coating film forming precursor and the photochemical organic metal precursor to the solvent or by adding the resin coating film forming precursor after the photochemical organic metal precursor is dissolved in the solvent.

Figure 2C:
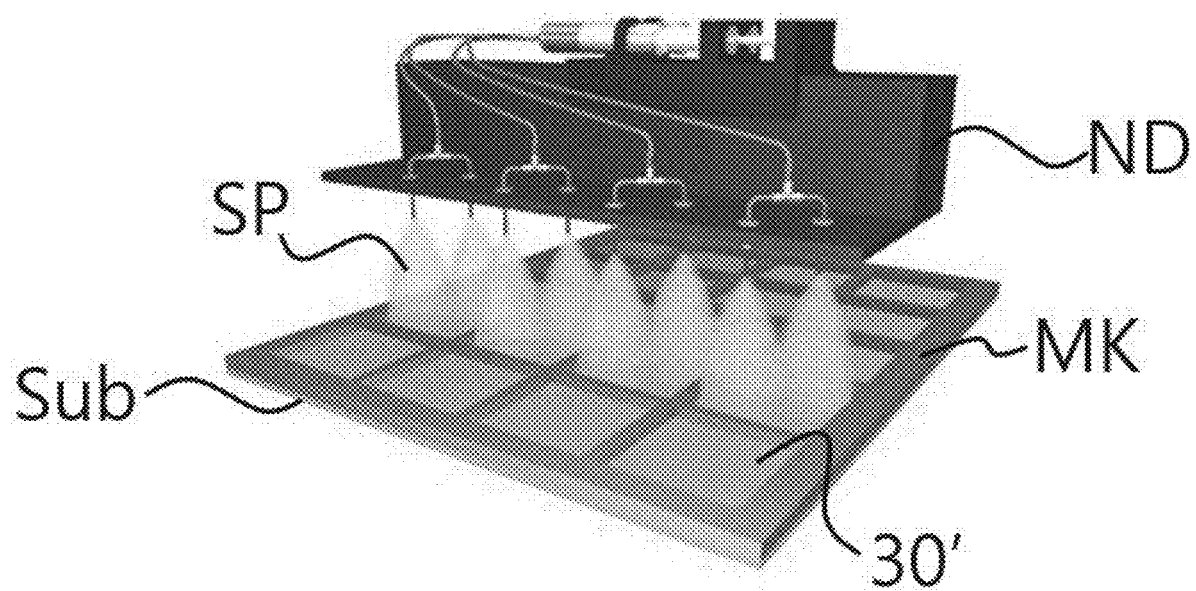
Figure 2D:
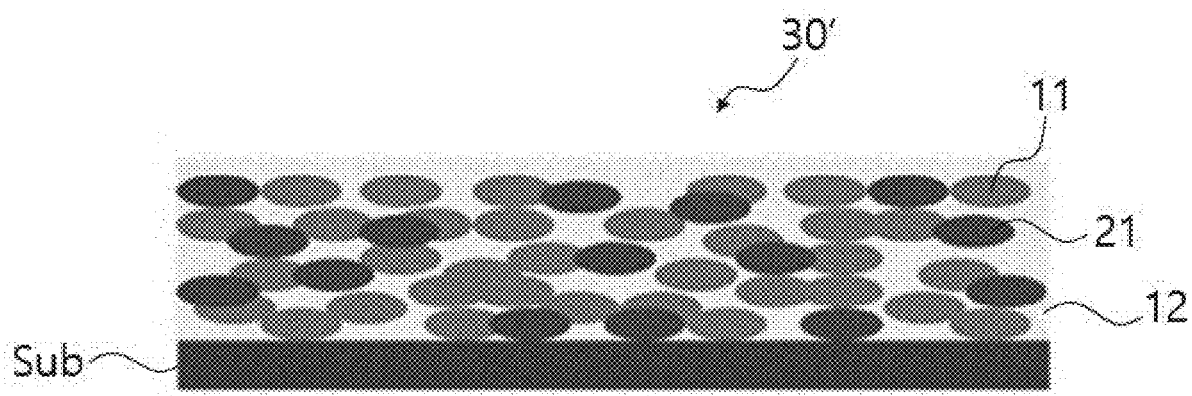

Next, a composite coating layer is formed by applying the composite coating precursor onto the substrate Sub. The composite coating precursor may be applied by using spin coating technique. However, the present invention is not limited thereto, and various coating techniques including silk screen technique, inkjet technique, spraying technique, or doctor blade technique may be applied. Referring to FIG. 2C, a method of forming a composite coating layer 30' on the large-scale substrate Sub by using a mask MK in a spray coating SP operation is exemplified. As a result, referring to FIG. 2D, the composite coating layer 30' including a solvent 12 having dissolved therein a resin coating film forming precursor 11, a photochemical organic metal precursor 21, and a photo-initiator (not shown) is formed on the substrate Sub. According to an embodiment, a drying operation for drying the composite coating layer 30' formed on the substrate Sub may be further performed.

Figure 2E:
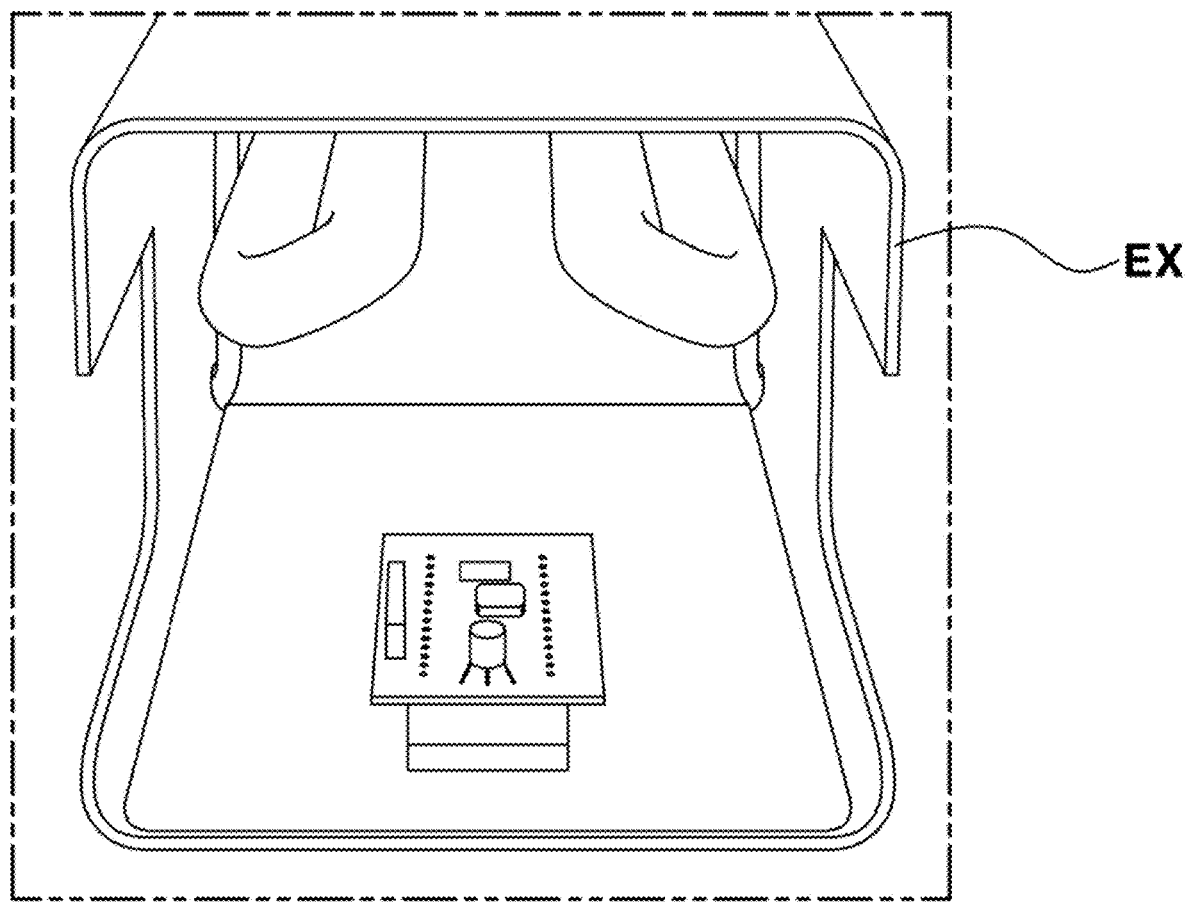

An exposing operation for exposing the composite coating layer 30' to UV rays may be performed. In FIG. 2E, a UV irradiation operation EX for mounting a substrate Sub having formed thereon the composite coating layer 30' and exposing the composite coating layer 30' to UV rays is shown.

Figure 2F:
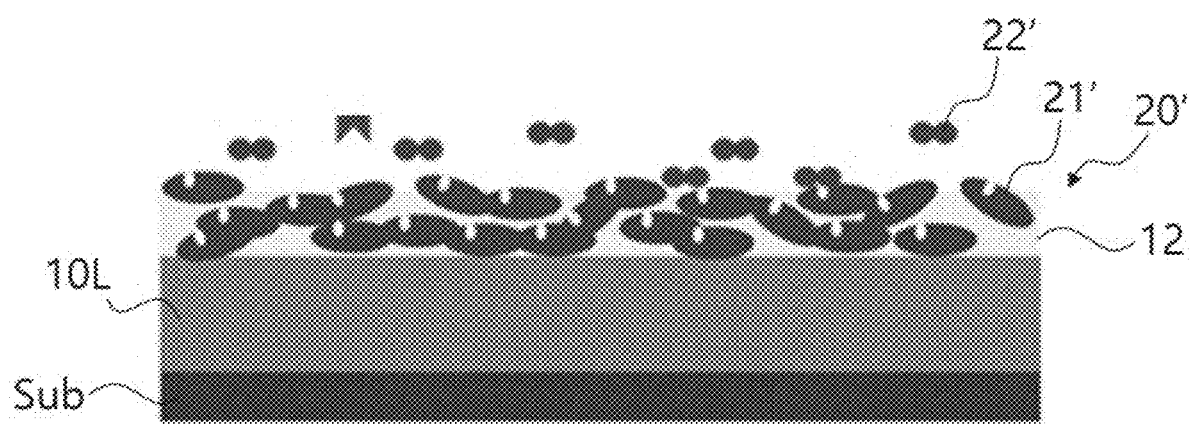

Due to the UV irradiation, the resin coating film forming precursor is cured through an photo coupling reaction, whereas the photochemical organic metal precursor is decomposed through an photo reaction, thereby forming metal ions. Referring to FIG. 2F, since the photo coupling reaction of the resin coating film forming precursor occurs faster kinetically than the photo reaction of the photochemical organic metal precursor, the resin coating layer 10L is formed first on the substrate Sub through the photo coupling reaction of the resin coating film forming precursor, and then, on the resin coating layer 10L, metal ions 21' formed relatively later as the photochemical organic metal precursor remaining in the composite coating layer 30' are exposed to UV irradiation, gradually react with oxygen, nitrogen, or carbon 22' in the surrounding of the metal ions 21'. As a result, due to the reaction of the metal ions 21', a surface functional metal compound layer is formed on the resin coating layer 10L, and thus, as shown in FIG. 1, a surface functional composite coating film (refer to 100 of FIG. 1) having a double layer stacked structure including the resin coating layer 10L formed on the substrate Sub and the surface functional metal compound layer 20L formed on the resin coating layer 10L is formed.

As described above, since the speed of formation of the resin coating layer 10L through an photo coupling reaction based on an UV irradiation is different from the speed of formation of the surface functional metal compound layer 20L through an photo reaction based on an UV irradiation, a composite coating layer having a double-layer stacked structure may be performed through a single UV irradiation operation. Furthermore, the interface between the resin coating layer 10L and the surface functional metal compound layer 20L is not a layer clearly distinguished from layers above and below the interface layer. Rather, the interface layer is a layer having composition that gradually changes according to depths due to different reaction speed. Therefore, a composite coating layer having a double-layer stacked structure in which the resin coating layer 10L and the surface functional metal compound layer 20L are coupled with each other via a stable interface without stress generation may be formed.

In the below embodiment, in order to provide a resin coating film forming precursor, monomers including dipentaerythritol hexaacrylate (DPHA) of Nippon Kayaku Co., Ltd, and DPEA-12 (poly(oxy-1,2-ethanediyl) of the "KAYARAD" series). Nalco2327 inorganic silica sol of Unichem Co., Ltd, and KBM-503 disilane coupling agent of Dow Corning Co., Ltd are used. As a viscosity control agent for a coating solution, propylene glycol monomethyl ether is used.

As a photochemical organic metal precursor, strontium-2ethylhexanate is used. As a photo-initiator, IRGACURE 184(1-Hydroxy-cyclohexyl-phenyl-ketone) is used. According to an embodiment of the present invention, an organic and inorganic composite resin layer including silica is formed as a resin coating layer (refer to 10L of FIG. 1), and a surface functional metal compound layer (refer to 20L of FIG. 1) including a strontium oxide layer is formed on the organic/inorganic composite resin layer, thereby providing a surface functional composite coating film having a double-layer stacked structure.

Figure 3:
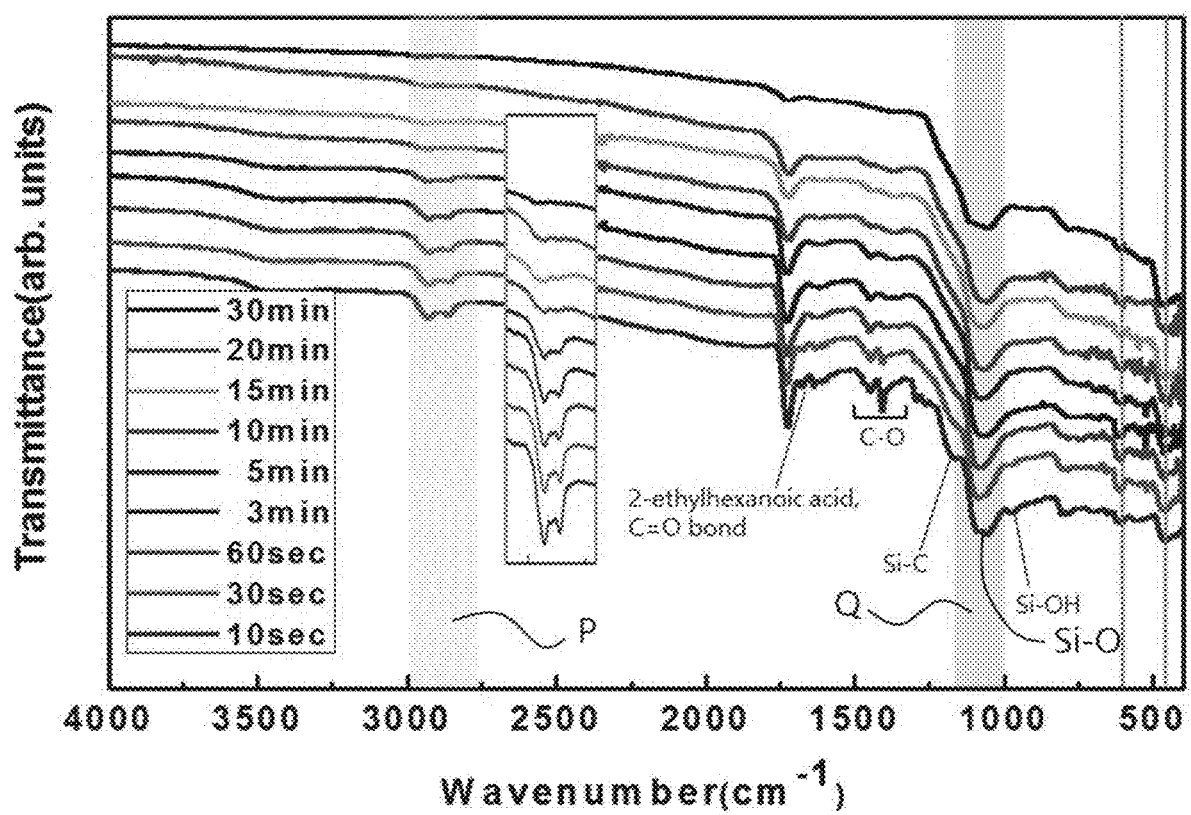
FIG. 3 is a graph showing a result of analyzing characteristics according to time periods for irradiating UV rays onto a composite coating film according to an embodiment of the present invention by using the FT-IR spectroscopy method.

FIG. 3 is a graph showing a result of analyzing characteristics according to time periods for irradiating UV rays onto a composite coating film according to an embodiment of the present invention by using the FT-IR spectroscopy method.

Referring to FIG. 3, according to time period for irradiating UV rays, characteristic peaks regarding atomic combinations of a material constituting a resin coating film are detected and, as UV irradiation continues, characteristics peaks regarding a functional metal compound layer are gradually detected. The area P indicates a characteristic peak of strontium-2ethylhexanate, which is a photochemical organic metal precursor, and indicates that the precursor is not yet decomposed by an UV irradiation for from about 10 seconds to about 3 minutes. On the contrary, the area Q indicates a characteristic peak regarding Si—O chemical bond of a silicon-containing resin coating film, where characteristic peaks of resin coating film forming precursors (that is, Si—C and Si—OH) disappear immediately after 10 seconds of UV irradiation and Si—O chemical bond peak of a resin coating film including Si—O chemical bond appears clearly. Therefore, according to an embodiment of the present invention, at a single UV irradiation operation, the speed of an photo coupling reaction for forming a resin coating layer is different from the speed of an photo reaction for forming a surface functional metal compound layer. More specifically, the speed of the photo coupling reaction is faster than the speed of the photo reaction. Therefore, in order to form a surface functional composite coating film, a resin coating layer is formed first, and then a surface functional metal compound layer is formed on the resin coating layer.

Figure 4:
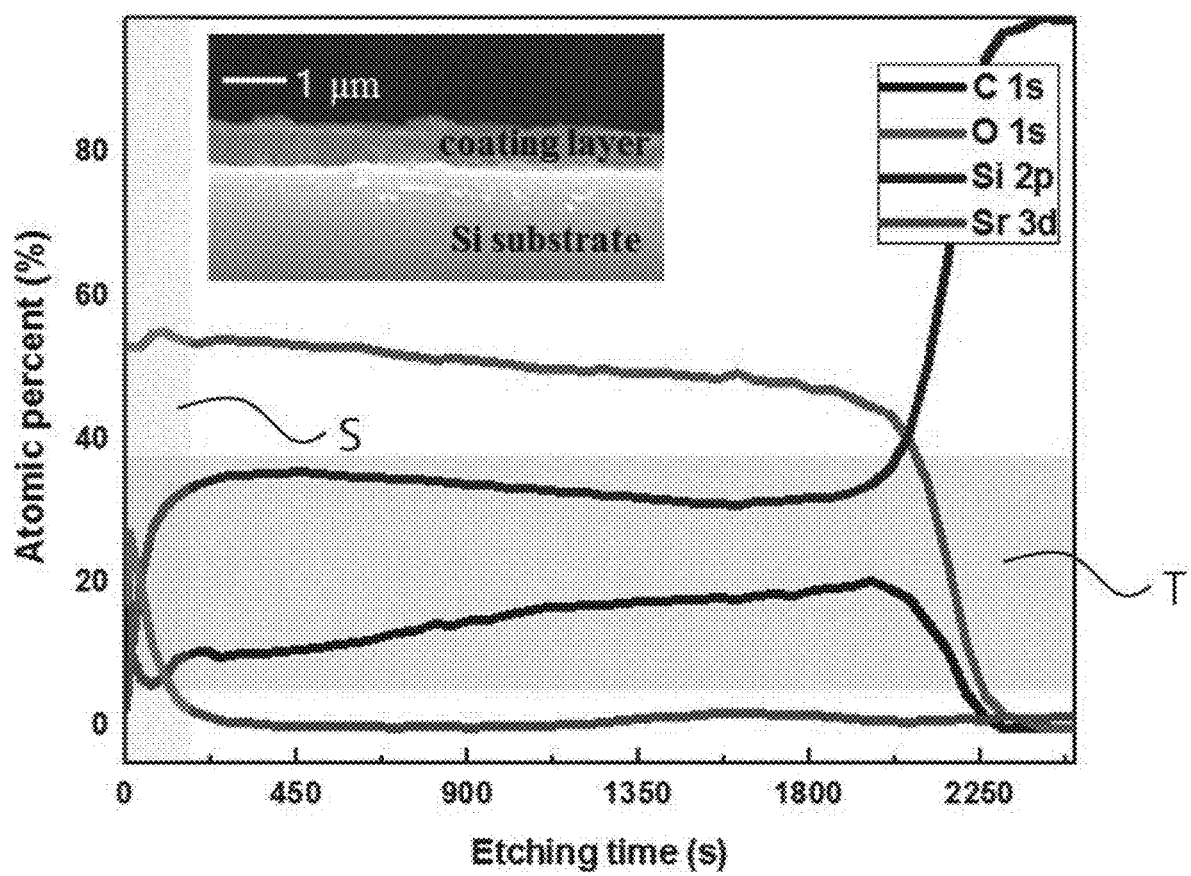
FIG. 4 shows a scanning electron microscopic (SEM) image (the small square in the graph) of a surface functional composite coating film fabricated according to an embodiment the present invention is not limited thereto and a graph regarding ingredients thereof according to depths.

FIG. 4 shows a scanning electron microscopic (SEM) image (the small square inserted in the graph) of a surface functional composite coating film fabricated according to an embodiment of the present invention and a graph regarding ingredients thereof according to depths.

Referring to FIG. 4, at a surface layer of the surface functional composite coating film, excess strontium (Sr) and oxygen (O) are detected. As the depth increases, strontium (Sr) ingredient gradually decreases, and carbon (C) and silicon (Si), which are ingredients of the resin coating layer (lower layer), begin to be detected. In other words, a metal oxide is mainly concentrated and localized at the top surface of the surface functional composite coating film, and the surface functional composite coating film has a double-layer stacked structure. Therefore, it is clear that a surface functional composite coating film having a double-layer stacked structure may be obtained in a single UV irradiation operation, where the interface in the double-layer stacked structure may have gradually changing composition.

Figure 5:
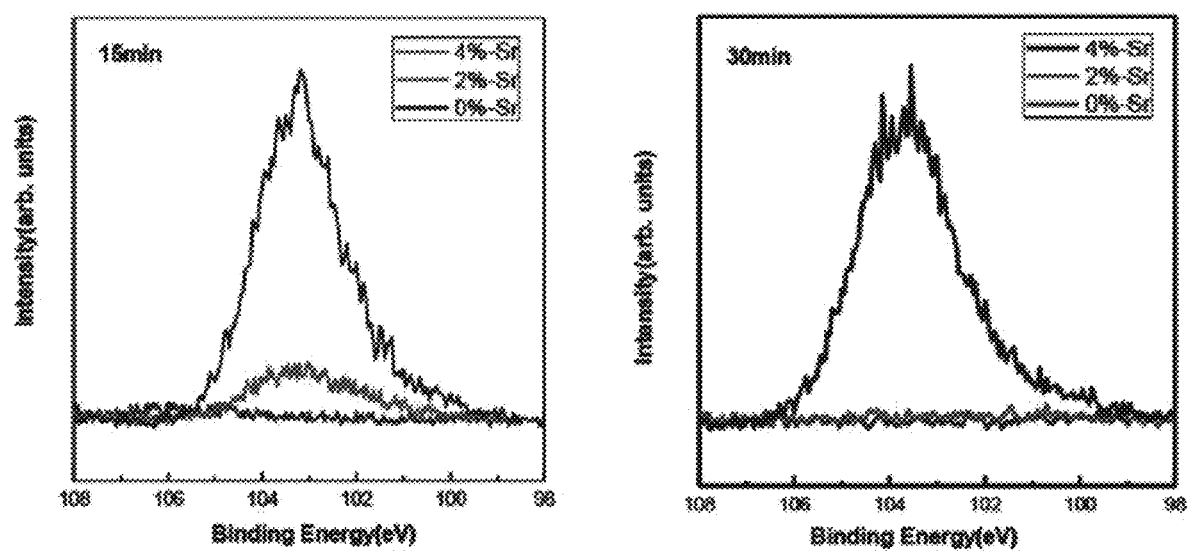
FIG. 5 is a diagram showing a result of detecting silicon (Si) according to concentrations of a photochemical metal oxide precursor (SrO) and UV irradiation time.

FIG. 5 is a diagram showing a result of detecting silicon (Si) according to concentrations of a photochemical metal oxide precursor and UV irradiation time.

Referring to FIG. 5, when UV rays are irradiated for 15 minutes, silicon (Si) is detected in correspondence to a low concentration (about 2%) of the photochemical organic metal precursor, whereas no silicon (Si) is detected in correspondence to a high concentration (about 4%) of the photochemical organic metal precursor. On the contrary, when UV rays are irradiated for 30 minutes, no silicon (Si) is detected is correspondence to the both low concentration (about 2%) and high concentration (about 4%) of the photochemical organic metal precursor. In other words, silicon (Si) is partially detected in correspondence to an insufficient concentration of the photochemical organic metal precursor and an insufficient UV irradiation time.

Figure 6:
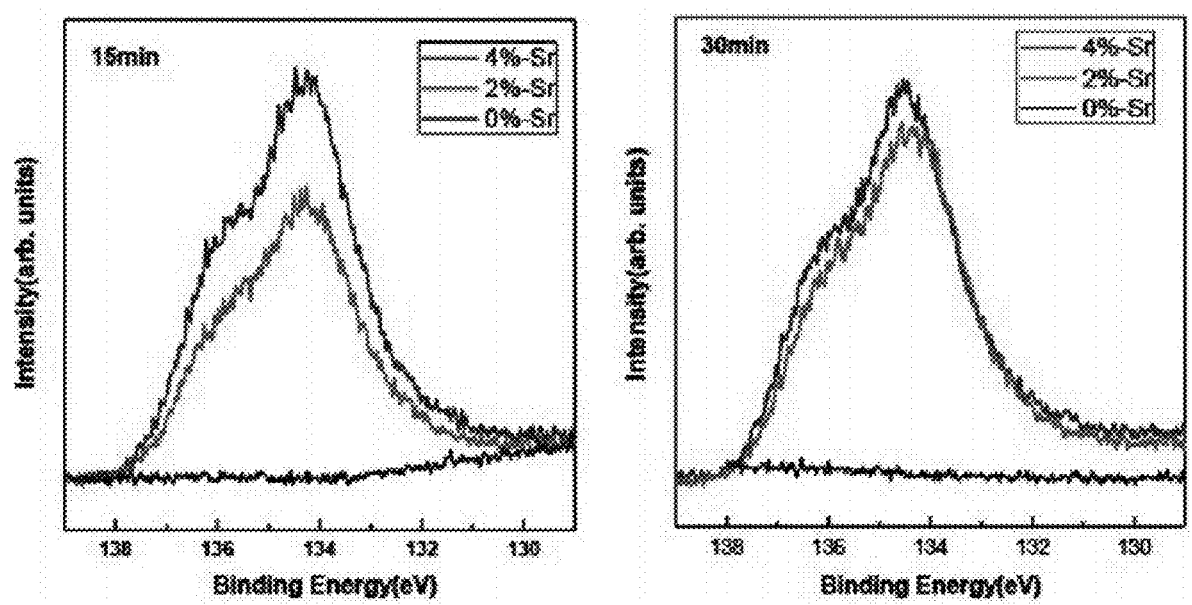
FIG. 6 is a diagram showing a result of measuring strontium (Sr) peaks according to concentrations of a photochemical metal oxide precursor (SrO) and UV irradiation times.

FIG. 6 is a diagram showing a result of measuring strontium (Sr) peaks according to concentrations of a photochemical metal oxide precursor and UV irradiation times.

Referring to FIG. 6, no silicon (Si) is detected from a surface and only strontium (Sr) is detected regardless of UV irradiation times and concentrations of the photochemical organic metal precursor. In other words, a SrO layer is formed on a surface of an UV-curing coating film. Furthermore, a difference between strength based on Sr concentration of a case corresponding to 15 minutes of UV irradiation and strength based on Sr concentration of a case corresponding to 30 minutes of UV irradiation is small. In other words, if UV irradiation is performed for a sufficiently time period, the effect of the concentration of the photochemical organic metal precursor to characteristics of a coating layer is small.

Figure 7:
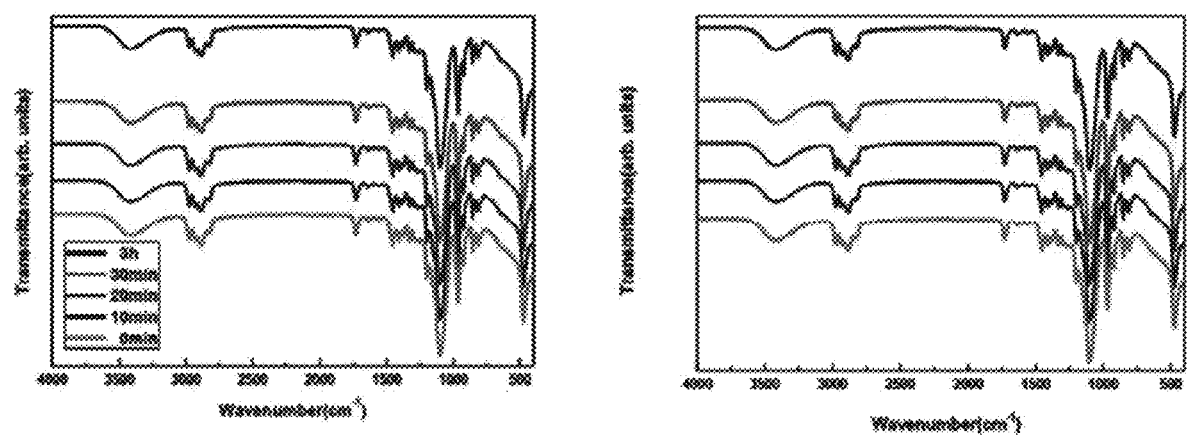
FIG. 7 is a diagram showing a result of dispersion stability after a photochemical organic metal precursor is mixed and stirred.

FIG. 7 is a diagram showing a result of dispersion stability after a photochemical organic metal precursor is mixed and stirred.

Referring to FIG. 7, the FT-IR result shows that there is no difference between coupling characteristics of solutions extracted from a same area of a mixed solution at different time points (the left graph and the right graph correspond to two different areas). In other words, heterogeneous materials are uniformly mixed with one another without a phase separation. The phenomenon supports that the surface functional composite coating film 100 according to an embodiment of the present invention is formed by adjusting reaction kinetic (reaction speed) instead of being formed based on phase separation between precursors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a surface functional composite coating film, the method comprising:
   a first step comprising forming a solution comprising a surface functional resin coating film forming precursor and a photo-initiator;
   a second step comprising forming a composite coating sol by stirring a photochemical organic metal precursor in the solution formed in the first step;
   a third step comprising applying the composite coating sol formed in the second step onto a substrate;
   a fourth step comprising drying the composite coating sol applied onto the substrate in the third step; and
   a fifth step comprising forming the surface functional composite coating film having a double-layer stacked structure by exposing the composite coating sol dried in the fourth step to UV irradiation,
   wherein the resin coating film forming precursor comprises at least one of an oligomer and a monomer that are capable of being photo-coupled,
   wherein the oligomer comprises an acrylate-based oligomer, a urethane-based oligomer, a polycarbonate-based oligomer, or a mixture thereof, wherein the monomer comprises an acryl-based photo crosslinkable monomer, a derivative thereof, or a combination thereof, wherein the photochemical organic metal precursor generates metal ions through the UV irradiation, wherein the photochemical organic metal precursor in a photo reaction based on the UV irradiation has a reaction speed lower than a curing speed of the resin coating film forming precursor in a photo coupling reaction based on the UV irradiation, wherein the fifth step further comprises sequentially forming a resin coating film cured by the UV irradiation and forming a metal-containing compound through a photo reaction of the photochemical organic metal precursor, wherein the metal-containing compound is a metal oxide, wherein the double-layer stacked structure comprises a resin coating layer on a substrate and a surface functional metal compound layer comprising the metal oxide on the resin coating layer, wherein an interface layer between the cured resin coating layer and the surface functional metal compound layer gradually changes composition distribution of the metal oxide of the metal compound layer, and wherein the surface functional metal compound layer is a light diffusing layer.

2. A method of fabricating a surface functional composite coating film, the method comprising:
   a first step comprising providing a resin coating film forming precursor curable through a photo coupling reaction based on a UV irradiation;
   a second step comprising providing a photochemical organic metal precursor that is capable of forming a metal-containing compound through a photo reaction based on the UV irradiation and exhibits a photo reaction speed slower than the curing speed of the resin coating film forming precursor through the photo coupling reaction;
   a third step comprising forming a coating solution comprising a composite coating precursor including a mixture of the resin coating film forming precursor and the photochemical organic metal precursor;
   a fourth step comprising forming a composite coating layer comprising the composite coating precursor; and
   a fifth step comprising forming the surface functional composite coating film having a double-layer stacked structure by exposing the composite coating layer to the UV irradiation, wherein the third step further comprises adding a photoinitiator to the coating solution, wherein the resin coating film forming precursor comprises at least one of an oligomer and a monomer that are capable of being photo coupled, wherein the oligomer comprises an acrylate-based oligomer, a urethane-based oligomer, a polycarbonate-based oligomer, or a mixture thereof, wherein the monomer comprises an acryl-based photo crosslinkable monomer, a derivative thereof, or a combination thereof, wherein the photochemical organic metal precursor generates metal ions through the UV irradiation, wherein the fifth step further comprises sequentially forming a resin coating film cured by the UV irradiation and forming a metal-containing compound through a photo reaction of the photochemical organic metal precursor, wherein the metal-containing compound is a metal oxide, wherein the double-layer stacked structure comprises a resin coating layer on a substrate and a surface functional metal compound layer comprising the metal oxide on the resin coating layer, wherein an interface layer between the cured resin coating layer and the surface functional metal compound layer gradually changes composition distribution of the metal oxide of the metal compound layer, and wherein the surface functional metal compound layer is a light diffusing layer.

3. The method of claim 2, wherein the photochemical organic metal precursor comprises a compound that includes metal central atoms of one or more types and a ligand including at least one of oxygen, nitrogen, and carbon.

4. The method of claim 3, wherein the ligand comprises at least one of acetylacetonate, dialkyl dithiocarbamate, carboxylate, pyridine, amine, diamine, arsine, diarsine, phosphine, diphosphine, arene, alkoxy ligands, alkyl ligands, and aryl ligands or a mixture thereof; or
   wherein the ligand comprises oxalato, halogen, hydrogen, hydroxy, cyano, carbonyl, nitro, nitrito, nitrate, nitrosyl, ethylene, acetylene, thiocyanato, isothiocyanato, aquo, azid, carbonato, or thio-carbonyl.

5. The method of claim 2, wherein a solvent for forming the coating solution comprises a carbonate-based solvent, an ether-based solvent, a ketone-based solvent, an alcohol-based solvent, or a mixture thereof.

6. The method of claim 2, wherein the coating solution comprises at least one of a coupling agent, a viscosity control agent, a pigment, and a surfactant.

* * * * *